United States Patent
Van Eden et al.

(10) Patent No.: US 12,461,452 B2
(45) Date of Patent: Nov. 4, 2025

(54) ELECTROSTATIC CLAMP

(71) Applicant: ASML Netherlands B.V., Veldhoven (NL)

(72) Inventors: Gustaaf Galein Van Eden, Utrecht (NL); Cung Vuong Nguyen, Roermond (NL); Ksenia Sergeevna Makarenko, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 126 days.

(21) Appl. No.: 18/252,294

(22) PCT Filed: Oct. 14, 2021

(86) PCT No.: PCT/EP2021/078514
§ 371 (c)(1),
(2) Date: May 9, 2023

(87) PCT Pub. No.: WO2022/106125
PCT Pub. Date: May 27, 2022

(65) Prior Publication Data
US 2024/0012341 A1    Jan. 11, 2024

(30) Foreign Application Priority Data
Nov. 18, 2020  (EP) .................................... 20208312

(51) Int. Cl.
*G03F 7/00*    (2006.01)
*H01L 21/683*    (2006.01)

(52) U.S. Cl.
CPC ...... *G03F 7/70708* (2013.01); *H01L 21/6833* (2013.01)

(58) Field of Classification Search
CPC ............ G03F 7/70708; H01L 21/6831; H01L 21/6833; H02N 13/00
See application file for complete search history.

(56) References Cited

U.S. PATENT DOCUMENTS

| | | | |
|---|---|---|---|
| 2005/0134828 A1 | 6/2005 | Ottens et al. | |
| 2015/0138688 A1* | 5/2015 | Hilbers | H01L 21/6833 361/234 |
| 2016/0300746 A1* | 10/2016 | Horiuchi | H01L 21/6831 |

FOREIGN PATENT DOCUMENTS

| | | | | |
|---|---|---|---|---|
| CN | 108807254 B | * | 1/2021 | ........ H01J 37/32715 |
| EP | 1 391 786 A1 | | 2/2004 | |

(Continued)

OTHER PUBLICATIONS

Machine translation of CN-108807254-B (Year: 2018).*

(Continued)

*Primary Examiner* — Steven H Whitesell
(74) *Attorney, Agent, or Firm* — Sterne, Kessler, Goldstein & Fox P.L.L.C.

(57) ABSTRACT

An electrostatic clamp for holding an object by electrostatic force is disclosed. The electrostatic clamp comprises a dielectric member having a plurality of conductive burls extending from a surface to define a plane in which the object is held, and a conductive element extending between and connecting the plurality of burls. The conductive element is disposed within one or more trenches formed on the surface of the dielectric member. Also disclosed is a method of manufacturing the electrostatic clamp.

15 Claims, 4 Drawing Sheets

(56) References Cited

FOREIGN PATENT DOCUMENTS

| | | |
|---|---|---|
| EP | 3 073 521 A1 | 9/2016 |
| JP | 2002-151235 A | 5/2002 |
| JP | 2003-133401 A | 5/2003 |
| JP | 2004-104114 A | 4/2004 |
| TW | 200929429 A | 7/2009 |
| TW | 201237567 A | 9/2012 |
| WO | WO 2013/160026 A2 | 10/2013 |
| WO | WO 2014/012749 A1 | 1/2014 |
| WO | WO 2014/127494 A1 | 8/2014 |
| WO | WO 2019/058918 A | 3/2019 |
| WO | WO 2020/177971 A1 | 9/2020 |

OTHER PUBLICATIONS

International Search Report and Written Opinion of the International Searching Authority directed to International Patent Application No. PCT/EP2021/078514, mailed Jan. 21, 2022; 10 pages.
Taiwanese Office Action directed to Taiwanese Patent Application No. 11420498900, May 12, 2025; 16 pages.
Japanese Notice of Reasons for Refusal directed to Japanese Patent Application No. 2023- 529977, mailed Jul. 29, 2025; 13 pages.

* cited by examiner

ELECTROSTATIC CLAMP

CROSS-REFERENCE TO RELATED APPLICATIONS

This application claims priority of EP application 20208312.7 which was filed on Nov. 18, 2020 and which is incorporated herein in its entirety by reference.

FIELD

The present invention relates to electrostatic clamps, and in particular electrostatic clamps for holding a substrate or reticle in a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features that are patterned on the substrate. Typical wavelengths currently in use are 365 nm (i-line), 248 nm (KrF), 193 nm (ArF) and 13.5 nm (EUV). A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

At such short wavelengths, precise positioning of the patterning device and/or substrate within the lithographic apparatus is essential.

Such lithographic apparatuses may be provided with one or more clamps to clamp the patterning device and/or substrate to an object support, such as a mask table or a wafer table respectively. The clamp may be, for example, a mechanical clamp, a vacuum clamp, or an electrostatic clamp. Electrostatic clamps may be particularly suited to operating at EUV wavelengths, since regions of an EUV lithographic apparatus necessarily operate under near vacuum conditions.

Electrostatic clamps are often maintained in a low-pressure hydrogen-rich environment, which is a generally non-conductive environment. As such, electric charge may accumulate on dielectric or ungrounded surfaces of the clamp. The accumulated charge may be non-uniformly distributed across the surfaces. Such non-uniformly distributed accumulated charge may have detrimental effects on the general operation of the lithographic apparatus. For example, a non-uniformly distributed charge on a charged surface of a clamp may result in unwanted deformation of components of the lithographic apparatus in relatively close proximity to the clamp, or of the substrate itself, potentially affecting precise positioning of the patterning device and/or substrate within the lithographic apparatus.

In particular, some electrostatic wafer clamps have a dielectric surface comprising equally spaced metal lines, known in the art as 'Manhattan lines', which conductively connect protrusions or 'burls' defining a plane for holding the patterning device and/or substrate. Such Manhattan lines and burls may provide a source of electron emission, thus affecting a magnitude and/or distribution of an electric field on the upper surface of the clamp.

An accumulated static charge can be removed by, for example, cleaning the clamp with isopropyl alcohol. However, this generally requires removing the clamp from within a high vacuum apparatus, and is not a practicable solution.

It is an object of at least one embodiment of at least one aspect of the present invention to obviate or at least mitigate at least one of the above identified shortcomings of the prior art.

SUMMARY

According to a first aspect of the disclosure, there is provided an electrostatic clamp for holding an object by electrostatic force. The clamp comprises a dielectric member having a plurality of conductive burls extending from a surface to define a plane in which the object is held, and a conductive element extending between and connecting the plurality of burls. The conductive element is disposed within one or more trenches formed on the surface of the dielectric member.

Advantageously, by recessing the conductive element in the dielectric member, e.g. in the trench, triple-point junctions and any sharp edges of the conductive element may face the dielectric sidewalls of the trench. As such, any field amplification which may occur at these locations may provide limited field emission of electrons, as electrons are stopped by the adjacent sidewalls of the trench. As such, a build-up of parasitic charges on the surface of the dielectric member due to field emission from the conductive element is substantially reduced. Therefore, the above-described problems of cycle-induced charging may be sufficiently mitigated, to the extent that alternative solutions such as in-line discharging or treatment of the dielectric surface, which may reduce availability of the clamp, reduce production efficiencies and/or incur potential surface damage, can be avoided.

The conductive element may be disposed at or below a level of the surface of the dielectric member.

A triple-point junction comprising a junction between the dielectric member and the conductive element may be below a level of the surface of the dielectric member. The triple-point junction may comprise a junction between the dielectric member, the conductive element and a vacuum or near-vacuum.

Each burl may comprise a dielectric material and a conductive layer.

The conductive element may be formed as an extension of the conductive layer.

The electrostatic clamp may comprise a layer of insulating or dielectric material formed over the conductive element.

Advantageously, by completely embedding the conductive element by forming layer of insulating or dielectric material formed over the conductive element, any field amplification which may have occurred at triple-points between the conductive element, sidewalls of the trench and a near-vacuum environment may be prevented from field emission of electrons, as electrons are stopped by the surrounding dielectric and/or insulating material. As such, a build-up of parasitic charges on the surface of the dielectric member due to field emission from the electrically conductive element is prevented.

The layer of insulating or dielectric material may be substantially flush with the surface of the dielectric member.

The conductive element may be conductively coupled to a ground reference.

The burls may be arranged in concentric rings on the surface of the dielectric member.

The electrostatic clamp may comprise a plurality of conductive elements. Each conductive element may extend between and connects a plurality of burls arranged in a ring.

The object may be a substrate used in lithographic projection techniques. The object may be a lithographic projection reticle or reticle blank in at least one of a lithographic projection apparatus, a reticle handling apparatus, and a reticle manufacturing apparatus.

The electrostatic clamp may further comprise an electrode configured to create a potential difference across the dielectric member to generate an electrostatic clamping force.

According to a second aspect of the disclosure, there is provided a lithographic apparatus comprising an electrostatic clamp according to the first aspect.

According to a third aspect of the disclosure, there is provided a method of manufacturing an electrostatic clamp for holding an object by electrostatic force in a lithographic apparatus. The method comprises a step of forming a plurality of burls and one or more trenches extending between the plurality of burls on a surface of a dielectric member.

The method comprises a step of forming a conductive layer over the plurality of burls and the surface of the dielectric member.

The method comprises a step of removing a portion of the conductive layer from the surface of the dielectric member to define a conductive element disposed within the one or more trenches and extending between and connecting the plurality of burls.

The method may further comprise forming a layer of insulating or dielectric material over the conductive element.

The above summary is intended to be merely exemplary and non-limiting. The disclosure includes one or more corresponding aspects, embodiments or features in isolation or in various combinations whether or not specifically stated (including claimed) in that combination or in isolation. It should be understood that features defined above in accordance with any aspect of the present disclosure or below relating to any specific embodiment of the disclosure may be utilized, either alone or in combination with any other defined feature, in any other aspect or embodiment or to form a further aspect or embodiment of the disclosure.

BRIEF DESCRIPTION OF THE DRAWINGS

Embodiments of the invention will now be described, by way of example only, with reference to the accompanying schematic drawings, in which.

DETAILED DESCRIPTION

Figure 1:
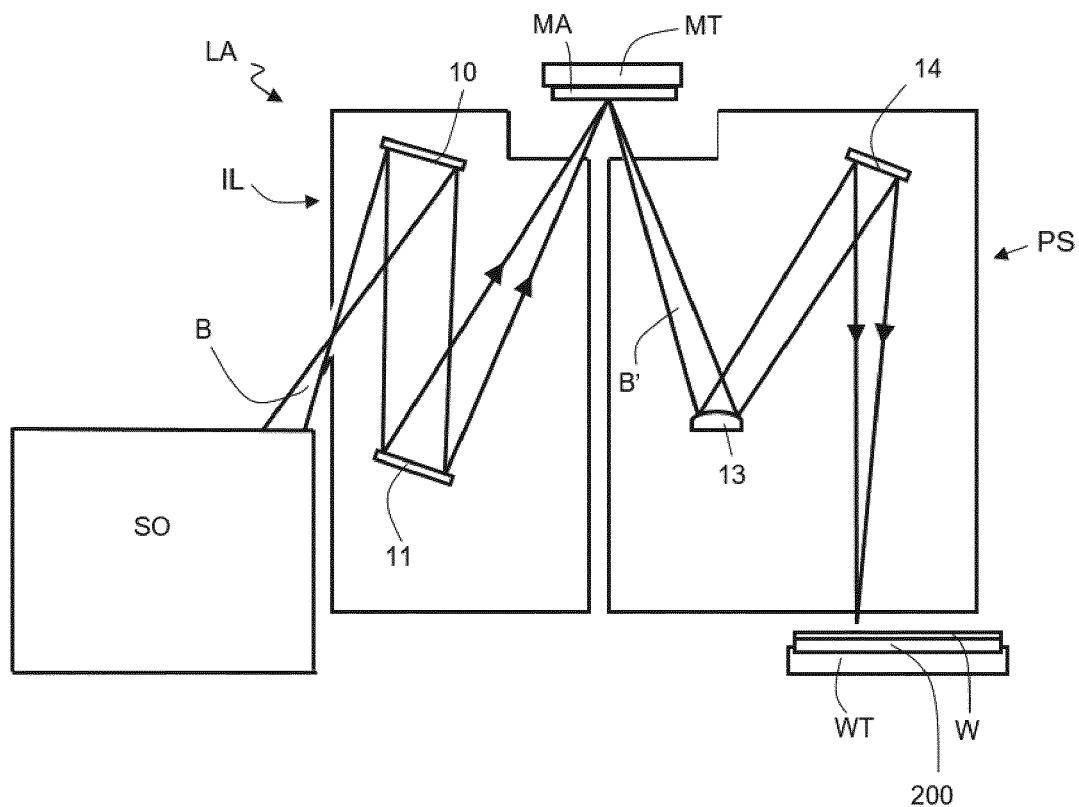
FIG. 1 depicts a lithographic system comprising a lithographic apparatus and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate support WT, also known as a substrate table, configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate support WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13,14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL) or any other radiation source that is capable of generating EUV radiation.

The substrate support comprises a clamp 200, also known as a chuck, configured to clamp the substrate W to the substrate support WT. The clamp 200 may be held within a recess in the substrate support WT. The clamp 200 is an electrostatic clamp 200, and is described in more detail with reference to FIG. 2.

The main body of the electrostatic clamp 200 generally corresponds in shape and size to the substrate W. At least on an upper surface of the clamp, e.g. a surface adjacent the substrate W in use, the clamp has projections, known in the art as burls. The burls extend from the upper surface of the clamp to define a plane in which the substrate W is held.

It will be appreciated that the term 'upper' is used in the context of the example lithographic apparatus LA of FIG. 1, wherein the electrostatic clamp 200 is depicted in a particular orientation. It will be understood that the disclosed clamp may be disposed in various orientations, and therefore the term 'upper' should be taken in the context of a particular described use case.

In a practical embodiment, there can be many hundreds, thousands, or tens of thousands, of burls distributed across a clamp of diameter, e.g., 200 mm, 300 mm or 450 mm. Tips of the burls generally have a small area, e.g. less than 1 $mm^2$, such that the total area of all of the burls extending from the upper surface of the electrostatic clamp 200 is less than about 10% of the total area of the total surface area of the upper surface. Because of the burl arrangement, there is a high probability that any particle that might lie on the surface of the substrate W, electrostatic clamp 200 or substrate support WT will fall between burls and will not therefore result in a deformation of the substrate or substrate holder. The burl arrangement, which may form a pattern, can be regular or can vary as desired to provide appropriate distribution of force on the substrate W and substrate support WT.

Figure 2:
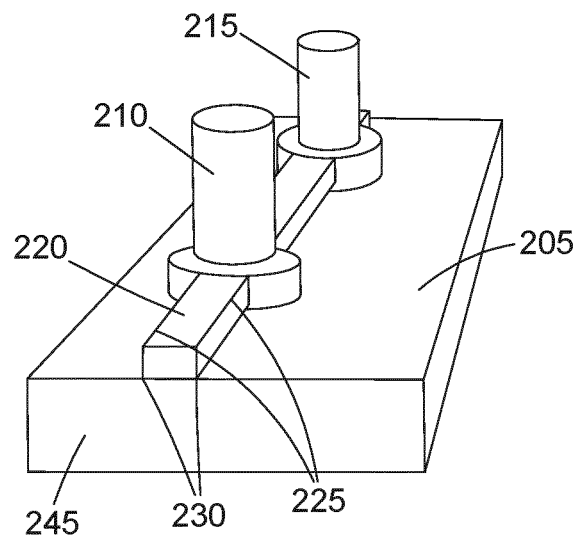
FIG. 2 depicts a perspective view of a portion of an electrostatic clamp having an plurality of conductive burls connected by a Manhattan line.

FIG. 2 depicts a perspective view of a portion of a dielectric member 245 of an electrostatic clamp 200, the dielectric member 245 having a surface 205, e.g. a surface adjacent the substrate W in use.

The depicted portion shows a first burl 210 and a second burl 215. Each burl 210, 215 is provided with an electrically conductive layer or coating, and coupled by an electrically conductive element 220. The dielectric surface 205 of the electrostatic clamp 200 may comprise a plurality of such electrically conductive elements 220, which may be laid out in a generally repetitive and/or regular pattern, and thus known in the art as "Manhattan lines".

The electrically conductive element 220, is formed on a dielectric surface 205 of the electrostatic clamp 200, such that the electrically conductive element 220 is raised, e.g. not flush, relative to the dielectric surface 205 of the electrostatic clamp 200.

In use, the dielectric surface 205 of the electrostatic clamp 200 may accumulate excessive electric charge locally next to the electrically conductive element 220 as a result of repeated clamping. This phenomenon is known in the art as 'Cycle-Induced-Charging' (CIC), and may lead to unstable or unevenly distributed clamping forces acting between the substrate W and the electrostatic clamp 200. Such forces may, for example, deform the substrate W and thus potentially affect precise positioning of the substrate W within the lithographic apparatus LA.

Furthermore, the structure of the electrically conductive element 220, and in particular sharp edges 225 and triple-point junctions 230, e.g. a junction of the electrically conductive element 220, dielectric surface 205 and a near-vacuum, may lead to Fowler-Nordheim electron field emission. The Fowler-Nordheim electron field emission may be followed by charge spreading on the dielectric surface 205 via successive secondary electron emission events and charge hopping via available trapping sites. Such charge may build-up on the dielectric surface 205, wherein an excess of such charge may negatively affect clamping stability.

Figure 3:
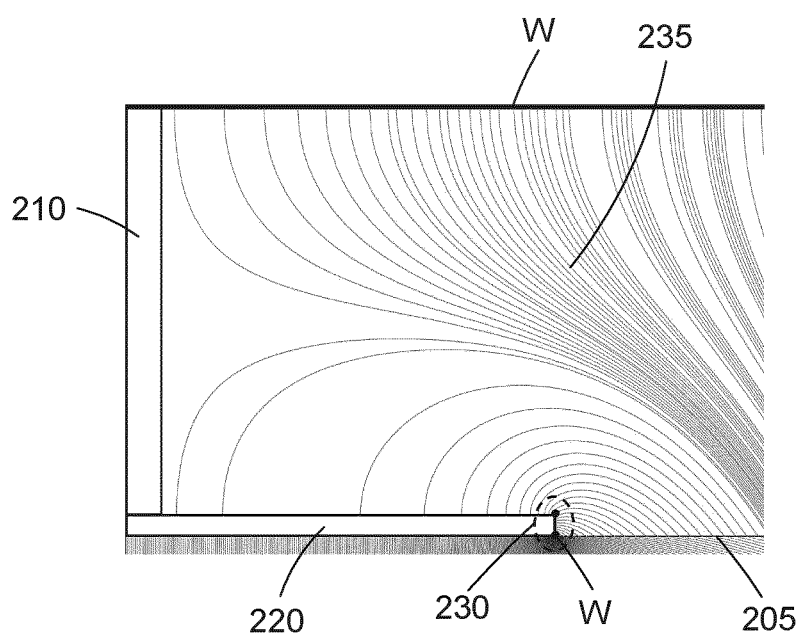
FIG. 3 depicts a distribution of electric field between the electrostatic clamp of FIG. 1 and a substrate.

This is illustrated in more detail in FIG. 3, which depicts a distribution of an electric field between the electrostatic clamp 200 of FIG. 1 and the substrate W.

The diagram of FIG. 3 depicts the dielectric surface 205 of the portion of the electrostatic clamp 200 depicted in FIG. 2. Also shown in cross-section is the electrically conductive element 220, one of the burls 210, and the substrate W supported by the burl 210.

In use, a volume 235 between the substrate W, the electrically conductive element 220, the burl 210 and the dielectric surface 205 would be a relatively low-pressure or near-vacuum environment. A distribution of electric field lines in this volume 235 is also depicted.

As discussed above, a problem with the electrically conductive element 220 is that it may act as a source of electrons, which settle on the dielectric surface 205 and accumulate over time, thus creating an undesirable static charge.

That is, in case of a high voltage potential on an electrode (not shown in FIG. 3) of the electrostatic clamp 200, a strong electric field may exist inside the dielectric member 245 having the dielectric surface 205, and in the volume 235. As an electric field is always orthogonal to a conducting surface, the field around the sharp edges 225 and triple-point junctions 230 of the electrically conductive element 220 is amplified.

In FIG. 3, the density of electric field lines indicate the electric field strength. Field enhancement is clearly visible at the sharp edges 225 and triple-point junctions 230 of the electrically conductive element 220.

That is, when such high fields are directed towards the sharp edges 225 and triple-point junctions 230—as is the case during positive electrode potential—field emission arises where electrons are extracted from the conductive materials of the electrically conductive element 220 and released in the in the volume 235, where they are accelerated by the electric field. The electric field is particularly high at these locations because the electric field generated at an edge of a conductor is inversely proportional to the radius of the edge, so the sharper the edge the smaller the radius and thus the higher the electric field.

Figure 4A:
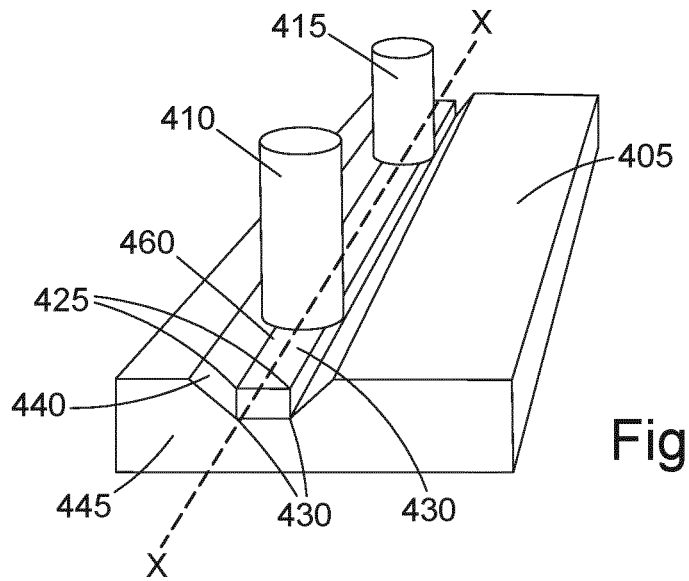
FIG. 4a depicts a perspective view of a portion of an electrostatic clamp having a conductive element disposed within a trench formed on the surface of the dielectric member, according to a first embodiment of the disclosure.

FIG. 4a depicts a perspective view of a portion of an electrostatic clamp having an electrically conductive element 420 disposed within a trench 440 formed on the surface 405 of a dielectric member 445, according to a first embodiment of the disclosure.

The portion of the electrostatic clamp depicted in FIG. 4a may be for a clamp 200 configurable to electrostatically clamp a substrate, e.g. substrate W, used in the lithographic apparatus LA. Additionally or alternatively, the portion of the electrostatic clamp depicted in FIG. 4a may be for a clamp configurable to electrostatically clamp a lithographic projection reticle or reticle blank in at least one of a lithographic projection apparatus, a reticle handling apparatus, and a reticle manufacturing apparatus.

Also shown is a first burl 410 and a second burl 415 extending from the dielectric member 445. Although the burls 410, 415 are depicted as cylindrical, it will be appreciated that the burls 410, 415 can have other shapes suitable for supporting an object, e.g. the substrate W or a reticle (not shown). In some embodiments, the burls 410, 415 have the same shape and dimensions throughout their height. In other embodiments, the burls 410, 415 may be tapered. The burls 410, 415 may also vary in dimensions. For example, burls in different embodiments may project a distance of from approximately 1 micrometer to approximately 5 millimeters.

Although only two burls 410, 415 are shown in FIG. 4a, it will be appreciated that the electrostatic clamp map comprise many more burls, such as hundreds, thousand or even tens of thousands of burls, wherein the burls define a plane 470 for supporting an object such as the substrate W.

Furthermore, for purposes of example only, the electrically conductive element 420 is depicted as being straight, e.g. the burls 410, 415 are arranged on a linear path defined by the straight electrically conductive element 420. In an example embodiment, the electrostatic clamp may comprise a plurality of straight electrically conductive elements 420 arranged in parallel or in another pattern, wherein the burls are also arranged in straight lines.

In other embodiments falling within the scope of the disclosure, the electrically conductive elements 420 may have different shapes or arrangements, such as curves, circles or spirals. In some embodiments, the electrically conductive elements 420 may be arranged to radially extend from a perimeter and/or center of the dielectric surface 405.

In some embodiments, the burls may be arranged in concentric rings on the surface 405 of the dielectric member 445, and a plurality of electrically conductive elements may extend between and connect each of the plurality of burls arranged in the rings.

As described above, in the embodiment of FIG. 4a, the electrically conductive element 420 is disposed within a trench 440 formed on the surface 405 of the dielectric member 445. In the example embodiment of FIG. 4a, the trench 440 is formed with sloping sidewalls. For example, in some embodiments an angle of the slope relative to a plane defined by the surface 405 of the dielectric member 445 may be between 30 and 40 degrees. Such sloping sidewalls may be formed by a process of wet-etching, as described in more detail below.

In the example embodiment of FIG. 4a, sidewalls of the trench 440 are substantially flat. In other embodiments falling within the scope of the disclosure, sidewalls of the trench 440 may be curved or generally nonlinear. As such, in some embodiments, a process of forming the trench 440 may comprise isotropic wet-etching and in other embodiments the process of forming the trench 440 may comprise anisotropic wet-etching.

In embodiments of the disclosure, the electrically conductive element 420 is disposed at or below a level of the surface 405 of the dielectric member 465. As shown in FIG. 4a, an upper surface 460 of the electrically conductive element 420 is below, e.g. relatively lower than, the upper surface 405 of the dielectric member 445. In some embodiments, the upper surface 460 of the electrically conductive element 420 may be substantially level with the upper surface 405 of the dielectric member 445. In some embodiments, the upper surface 460 of the electrically conductive element 420 may be below the level of the surface 405 of the dielectric member 445 by a distance in the region of 1 micrometer.

In particular, triple-point junctions 430 comprising junctions between the dielectric member 445 and the electrically conductive element 420 are below a level of the surface 405 of the dielectric member 445.

Advantageously, by recessing the electrically conductive element 420 in the dielectric member 445, e.g. in the trench 440, the triple-point junctions 430 and the sharp edges 225 face the dielectric trench wall. As such, any field amplification which may occur at these locations may provide limited field emission of electrons, as electrons are stopped by the adjacent sidewalls of the trench 440. As such, a build-up of parasitic charges on the surface 405 of the dielectric member 445 due to field emission from the electrically conductive element 420 may be substantially reduced.

Advantageously, the above-described problems of cycle-induced charging may be sufficiently mitigated, to the extent that alternative solutions such as in-line discharging or treatment of the dielectric surface 405, which may reduce availability of the clamp, reduce production efficiencies and/or incur potential surface damage, can be avoided.

Figure 4B:
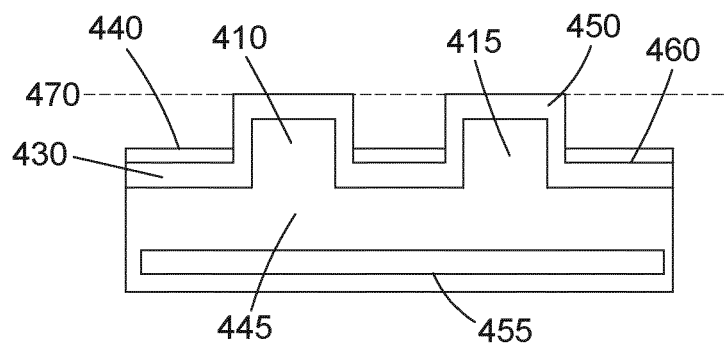
FIG. 4b depicts a cross-sectional view of a portion of the electrostatic clamp of FIG. 4a viewed along line X-X.

FIG. 4b depicts a cross-sectional view of a portion of the electrostatic clamp of FIG. 4a, the cross-section viewed along the line X-X.

It can be seen from FIG. 4b that the dielectric member 445 comprises a plurality of burls 410, 415 extending from the surface 405 of the dielectric member 445 to define the plane 470 in which the object is held. Each burl 410, 415 comprises a dielectric material and a conductive layer 450. It will be appreciated that the dielectric material may be the same dielectric material that forms the dielectric member 445. For example, in some embodiments, lithographic processes are used to define the burls 410, 415 on the surface 405 or the dielectric member 445 during manufacture of the electrostatic clamp, as described in more detail below.

It can also be seen in the example embodiment of FIG. 4b that the electrically conductive element 420 is formed as an extension of the conductive layer 450. For example, in some embodiments the conductive burls 410, 415 are formed by providing a conductive layer 450, e.g. a coating such as TiN or CrN, over the plurality of dielectric burls 410, 415 and the surface of the dielectric member 445, and subsequently removing a portion of the conductive layer 450 from the surface of the dielectric member 445 to define the electrically conductive element 420 disposed within the trench 440, and extending between and connecting the plurality of burls 410, 415. The conductive layer 450 would extend over the surface of the burls 410, 420, such that the conductive layer 450 defines the plane 470 in which the object is held. Such methods of manufacture are described in more detail below.

Also depicted in FIG. 4b is an electrode 455. For purposes of example only, the electrode 455 is depicted as embedded within the dielectric member 445. It will be appreciated that in other embodiments, the electrode 455 may be formed as a separate layer or component of the electrostatic clamp, and in some embodiments the electrostatic clamp may comprise a plurality of electrodes. In use, the electrode 455 may be configured to create a potential difference across the dielectric member 445 to generate an electrostatic clamping force. The electrically conductive element 420, and hence all of the burls 410, 415, may be conductively coupled to a ground reference. It will be understood that ground may be at zero volts, or may be at some other fixed voltage. An advantage of ground being at zero volts is that the clamp may be readily connected to other parts of the lithographic apparatus LA that may also reside at a ground voltage potential.

It will also be understood that, by recessing the burls 410, 415 into the trench 440, an overall height of said burls 410, 415 relative to the surface 405 of the dielectric member 445 will be reduced. As such, in some embodiments, a height of the burls 410, 415 may be increased accordingly by an amount corresponding to a depth of the trench 440 to ensure that the burls 410, 415 remain of sufficient height that they continue to trap particles between them.

Alternatively, the reduced burl height may be maintained if it is assessed that an overall final height of the burls 410, 415 even when recessed in the trench 440 would be sufficient to trap defect particles between the burls 410, 415. Advantageously, a reduced burl height may also reduce cycle-induced-charging, because to achieve a particular clamping pressure an electrode voltage may be reduced relative to an electrode voltage required to achieve the same clamping pressure without having reduced the burl height.

Figure 5:
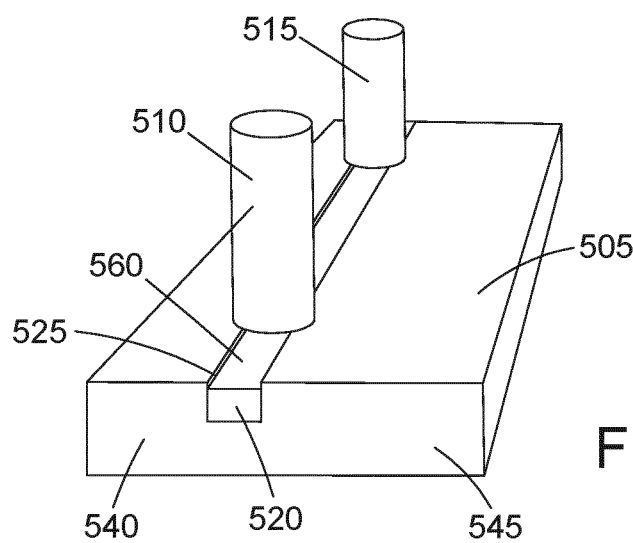
FIG. 5 depicts a perspective view of a portion of an electrostatic clamp having a conductive element disposed within a trench formed on the surface of the dielectric member, according to a second embodiment of the disclosure.

FIG. 5 depicts a perspective view of a portion of an electrostatic clamp having an electrically conductive element 520 disposed within a trench 540 formed on the surface 505 of a dielectric member 545, according to a second embodiment of the disclosure.

Also shown is a first burl 510 and a second burl 515 extending from the dielectric member 545. Although only two burls 510, 515 are shown in FIG. 5, as described in more detail above it will be appreciated that the electrostatic clamp map comprise many more burls for supporting an object such as the substrate W.

In the example embodiment of FIG. 5, the trench 540 is formed with vertical sidewalls. For example, in some embodiments an angle of the sidewalls relative to a plane defined by the surface 505 of the dielectric member 545 is substantially 90 degrees. The trench 540 may be formed by a process of reactive ion etching, as described in more detail below.

In embodiments of the disclosure, the electrically conductive element 520 is disposed at or below a level of the surface 505 of the dielectric member 565. As shown in FIG. 5, an upper surface 560 of the electrically conductive element 520 is disposed below the level of the upper surface 505 of the dielectric member 545. That is, the electrically conductive element 520 is completely recessed, e.g. embedded, within the dielectric member 545.

In some embodiments, the upper surface 560 of the electrically conductive element 520 is below the level of the surface 505 of the dielectric member 545 by a distance in the region of 1 micrometer.

In other embodiments, the upper surface 560 of the electrically conductive element 520 may be level with, e.g. flush with, the surface 505 of the dielectric member.

In particular, in the example embodiment of FIG. 5 it can be seen that triple-point junctions 230, 430 as shown in FIGS. 2 and 4*a* have been completely removed by embedding the electrically conductive element 520 within the dielectric member 445.

Although new triple-point junctions 525 are effectively formed at junctions between an upper surface 560 of the electrically conductive element 520 and sidewalls of the trench 540, these new triple-point junctions 525 are less problematic in terms of field emission of electrons. This is because the upper corners of the electrically conductive element 520 that form the triple-point junctions 525 are facing the sidewalls of the trench 540. As such, any field amplification which may occur at this location cannot lead to field emission of electrons, as electrons are directly stopped by the adjacent dielectric sidewalls of the trench 540.

Figure 6:
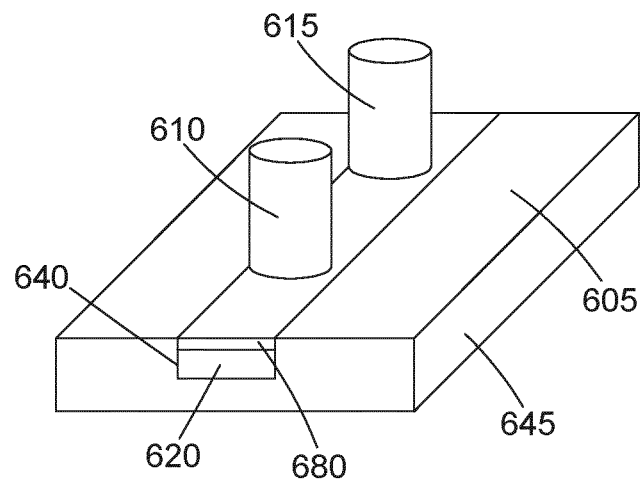
FIG. 6 depicts a perspective view of a portion of an electrostatic clamp having a conductive element disposed within a trench formed on the surface of the dielectric member, according to a third embodiment of the disclosure.

FIG. 6 depicts a perspective view of a portion of an electrostatic clamp having a conductive element 620 disposed within a trench 640 formed on the surface 605 of the dielectric member 645, according to a third embodiment of the disclosure.

Also shown is a first burl 610 and a second burl 615 extending from the dielectric member 645. Although only two burls 610, 615 are shown in FIG. 5*a*, as described in more detail above it will be appreciated that the electrostatic clamp map comprise many more burls for supporting an object such as the substrate W.

Similar to the embodiment of FIG. 5, the trench 640 is formed with vertical sidewalls, and a conductive element 620 is formed in the trench 640. For example, in some embodiments an angle of the sidewalls relative to a plane defined by the surface 605 of the dielectric member 645 is substantially 90 degrees. The trench 640 may be formed by a process of reactive ion etching, as described in more detail below.

It will be recognized that many features of the embodiment of FIG. 6 generally correspond to those of the embodiment of FIG. 5, and therefore are not described in further detail for purposes of brevity.

However, in contrast to the embodiment of FIG. 5, a layer 680 of insulating or dielectric material is formed over the conductive element 620. In the example embodiment of FIG. 6, the layer 680 of insulating or dielectric material is substantially flush with the surface 605 of the dielectric member 645. Methods of manufacture are described in more detail below.

It will be understood that such a layer of insulating or dielectric material may also be formed over the conductive element 420 of the embodiment of FIGS. 4*a* and 4*b*, e.g. an embodiment comprising a trench 440 having sloping sidewalls.

In both cases (sloping or vertical sidewall trenches), an effect of the layer of insulating or dielectric material is to completely embed the conductive element 620, such that no triple-point junctions are formed between the near-vacuum, the dielectric member 645 and the electrically conductive element 620.

Advantageously, by completely embedding the electrically conductive element 620, any field amplification which may occur at these locations may be prevented from field emission of electrons, as electrons are stopped by the surrounding dielectric and/or insulating material. As such, a build-up of parasitic charges on the surface 605 of the dielectric member 645 due to field emission from the electrically conductive element 620 is prevented.

Figure 7:
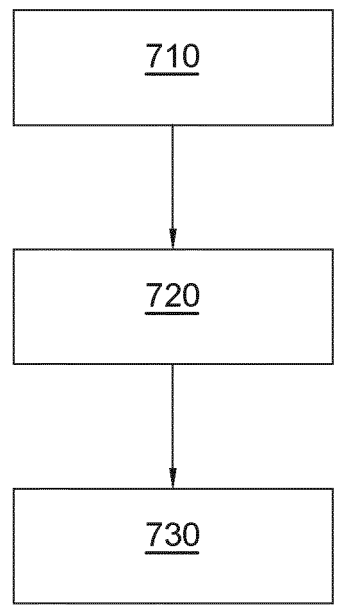
FIG. 7 depicts a method of manufacturing an electrostatic clamp for holding an object by electrostatic force in a lithographic apparatus, according to an embodiment of the disclosure.

FIG. 7 depicts a method of manufacturing an electrostatic clamp for holding an object by electrostatic force in a lithographic apparatus, according to an embodiment of the disclosure.

The method comprises a first step 710 of forming a plurality of burls and one or more trenches extending between the plurality of burls on a surface of a dielectric member.

The first step 710 may comprise deposition of a first layer of photoresist on a dielectric member such as a glass substrate, e.g. dielectric member 445, 545, 645. The first layer of photoresist may be deposited using known techniques, such as spin-coating or spraying.

A process of lithography may be uses to pattern the first layer of photoresist with a particular burl layout. A process of etching may be used to etch the dielectric member such that the burls are defined. Subsequently, any remaining first layer of photoresist is removed, leaving a dielectric surface having a plurality of defined burls.

Next, a second layer of photoresist may be deposited, patterned and exposed to define trenches including the burls, e.g. trenches 440, 540, 640.

In some embodiments, for example to form a trench 440 having vertical sidewalls as shown in the embodiment of FIG. 5a, the second layer of photoresist is suitable for reactive ion etching (RIE).

Subsequently, a process of etching the dielectric member forms the trenches 440, 540, 640. In some embodiments, for example when forming trenches having sloping sidewalls, the process of etching will be wet-etching. In some embodiments, for example when forming trenches having vertical sidewalls, the process of etching will be reactive ion etching. Next, the remaining second layer of photoresist is removed.

A second step 720 may comprise forming a conductive layer over the plurality of burls and the surface of the dielectric member. In some embodiments, this may comprise application of a CrN coating.

A third step 730 may comprise removing a portion of the conductive layer from the surface of the dielectric member to define a conductive element disposed within the one or more trenches and extending between and connecting the plurality of burls.

The third step 730 may comprise deposition of a third layer of photoresist, and subsequent patterning the third layer of photoresist using lithography. As such, the conductive elements, or 'Manhattan lines', within the trenches may be defined. Notably, a mask used for the lithographic process of the third step 730 may differ from the mask used to define the trenches in the first step 710, to compensate for under-etch.

The CrN outside the defined Manhattan lines' is then removed, and subsequently any remaining third layer of photoresist is removed.

It will be appreciated that the described method above process may be executed using in a wide variety of different processing conditions, all falling within the scope of the disclosed method. For example, the method may be executed using different types of photoresist, different mask designs, use of different etchants, different CrN deposition methods, and different CrN compositions, exact geometry of the edges, etc.

In some embodiments of the method, the remaining second layer of photoresist is not removed in the first step 710. Instead, the second step 720 comprises forming the conductive layer over the plurality of burls and the surface of the dielectric member, and over the remaining second layer of photoresist.

In this embodiment, the subsequent third step comprises a process of dissolving the remaining second layer of photoresist, such that the conductive layer outside the defined trenches is removed. In this embodiment, because the same second photoresist layer is for both step, there will automatically be a complete filling of the trench formed by reactive ion etching.

Some embodiments of the method may comprise a further step of forming a layer of insulating or dielectric material over the conductive element, e.g. to form the embodiment as depicted in FIG. 6 wherein the layer of insulating or dielectric material covers the triple-points comprising the sidewalls of the trenches and corners of the conductive elements. The layer of insulating or dielectric material does not extend over the burls.

The dielectric or insulating material may be spin-coated or sprayed, onto the conductive elements. A lithographic process, e.g. using one or more masks and photoresist, may be employed to restrict the layer of dielectric or insulating material to the trenches. The dielectric or insulating material may be cured or baked. The dielectric or insulating material may comprise a polymer. The dielectric or insulating material may comprise a silicon dioxide.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. An electrostatic clamp comprising:
a dielectric member comprising one or more trenches formed in a surface of the dielectric member, the one or more trenches each having a bottom surface and at least one side surface extending from the bottom surface to the surface of the dielectric member;
a plurality of conductive burls extending from the bottom surface and configured to define a plane in which an object is held; and
a conductive element extending between and connecting the plurality of conductive burls,
wherein the conductive element is disposed within the one or more trenches.

2. The electrostatic clamp of claim 1, wherein:
the conductive element is disposed at a level of the surface of the dielectric member or below the level of the surface of the dielectric member; and
an upper surface of the conductive element is below the level of the surface of the dielectric member by a distance in the region of 1 micrometer.

3. The electrostatic clamp of claim 1, wherein a triple-point junction comprising a junction between the dielectric member and the conductive element is below a level of the surface of the dielectric member.

4. The electrostatic clamp of claim 1, wherein each burl comprises a dielectric material and a conductive layer.

5. The electrostatic clamp of claim 4, wherein the conductive element is formed as an extension of the conductive layer.

6. The electrostatic clamp of claim 1, further comprising a layer of insulating or dielectric material formed over the conductive element.

7. The electrostatic clamp of claim 6, wherein the layer of insulating or dielectric material is substantially flush with the surface of the dielectric member.

8. The electrostatic clamp of claim 1, wherein the conductive element is conductively coupled to a ground reference.

9. The electrostatic clamp of claim 1, wherein the burls are arranged in concentric rings on the surface of the dielectric member.

10. The electrostatic clamp of claim 1, further comprising a plurality of conductive elements, wherein each conductive element extends between and connects a plurality of burls arranged in a ring.

11. The electrostatic clamp of claim 1, wherein the object is at least one of:
    a substrate used in lithographic projection techniques; and
    a lithographic projection reticle or reticle blank in at least one of a lithographic projection apparatus, a reticle handling apparatus, and a reticle manufacturing apparatus.

12. The electrostatic clamp of claim 1, further comprising an electrode configured to create a potential difference across the dielectric member to generate an electrostatic clamping force.

13. A lithographic apparatus comprising the electrostatic clamp of claim 1.

14. A method comprising:
    forming a plurality of burls and one or more trenches on a surface of a dielectric member, the one or more trenches each having a bottom surface and at least one side surface extending from the bottom surface to the surface of the dielectric member, and the plurality of burls each extending from the bottom surface of the at least one trench;
    forming a conductive layer over the plurality of burls and the surface of the dielectric member; and
    removing a portion of the conductive layer from the surface of the dielectric member to define a conductive element disposed within the one or more trenches and extending between and connecting the plurality of burls.

15. The method of claim 14, further comprising forming a layer of insulating or dielectric material over the conductive element.

* * * * *